US010916915B2

(12) United States Patent
Hung et al.

(10) Patent No.: US 10,916,915 B2
(45) Date of Patent: Feb. 9, 2021

(54) DISTRIBUTED FEEDBACK SEMICONDUCTOR LASER DEVICE

(71) Applicant: NATIONAL SUN YAT-SEN UNIVERSITY, Kaohsiung (TW)

(72) Inventors: Yung-Jr Hung, Kaohsiung (TW); Yen-Chieh Wang, Kaohsiung (TW); Ping-Feng Hsieh, Kaohsiung (TW); Wei Lin, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 16/228,774

(22) Filed: Dec. 21, 2018

(65) Prior Publication Data
US 2020/0203925 A1   Jun. 25, 2020

(51) Int. Cl.
*H01S 5/12*      (2006.01)
*H01S 5/343*    (2006.01)
*H01S 5/042*    (2006.01)
*H01S 5/028*    (2006.01)
*H01S 5/22*      (2006.01)

(52) U.S. Cl.
CPC .............. *H01S 5/12* (2013.01); *H01S 5/0282* (2013.01); *H01S 5/0425* (2013.01); *H01S 5/22* (2013.01); *H01S 5/34313* (2013.01); *H01S 2301/176* (2013.01)

(58) Field of Classification Search
CPC .. H01S 5/0282; H01S 5/34313; H01S 5/0425; H01S 5/22; H01S 5/343; H01S 2301/176; H01S 5/12; H01S 5/1231
USPC .......................................... 372/50.11, 50.22
See application file for complete search history.

(56) References Cited

U.S. PATENT DOCUMENTS

| | | | | |
|---|---|---|---|---|
| 5,274,660 | A * | 12/1993 | Abe ......................... | H01S 5/12 372/45.01 |
| 6,885,804 | B2 * | 4/2005 | Park ...................... | G02B 6/124 372/102 |
| 10,164,406 | B2 * | 12/2018 | Chimot ................. | H01S 5/1237 |
| 2003/0147617 | A1 * | 8/2003 | Park ....................... | G02B 6/124 385/131 |
| 2010/0322557 | A1 * | 12/2010 | Matsuda ............... | H01S 5/1228 385/37 |
| 2011/0235664 | A1 * | 9/2011 | Illek ....................... | H01S 5/12 372/44.01 |
| 2012/0002285 | A1 * | 1/2012 | Matsuda ............... | H01S 5/1215 359/576 |
| 2012/0091372 | A1 * | 4/2012 | Molnar ............ | H01L 27/14685 250/550 |

FOREIGN PATENT DOCUMENTS

TW           201342753 A    10/2013

* cited by examiner

*Primary Examiner* — Tuan N Nguyen
(74) *Attorney, Agent, or Firm* — CKC & Partners Co., LLC

(57) ABSTRACT

A distributed feedback (DFB) semiconductor laser device includes an active layer, a first grating layer and a second grating. The first grating layer has a first grating structure with a first grating period. The second grating layer has a second grating structure with a second grating period substantially different from the first grating period. The active layer, the first grating layer and the second grating layer are vertically stacked, and the equivalent grating period of the DFB semiconductor laser device is $(2 \times P1 \times P2)/(P1+P2)$, where P1 and P2 respectively represent the first grating period and the second grating period.

12 Claims, 13 Drawing Sheets

DISTRIBUTED FEEDBACK SEMICONDUCTOR LASER DEVICE

BACKGROUND

Technical Field

The present invention relates to a semiconductor laser device, and more particularly to a distributed feedback (DFB) semiconductor laser device that exhibits single wavelength light output.

Description of Related Art

Semiconductor laser technology mainly includes Fabry-Pérot (FP) laser, DFB laser and vertical cavity surface emitting laser (VCSEL). For DFB laser, its wavelength stability and side mode suppression ratio (SMSR) are key factors in production yield. A major reason for laser ineffectiveness is, a DFB laser device with a uniform and symmetric grating structure emits light at two stopband edges of the Bragg wavelength in correspondence with the grating structure rather than at the Bragg wavelength in correspondence with the grating structure, which results in unstable dual-wavelength light output. The wavelength stability and the SMSR can be improved by using a phase-shifted grating structure manufactured by utilizing electron beam lithography technology, but correspondingly, the manufacture cost and time significantly increase.

SUMMARY

The objective of the present invention is to provide a distributed feedback (DFB) semiconductor laser device that exhibits single mode outputting characteristics, i.e., the power difference between the main peak wavelength and the second highest peak wavelength is at least 30 dB, and enables high wavelength stability, high side mode suppression ratio (SMSR) and improved spatial hold burning effect during device operation. Moreover, the grating structure in the DFB semiconductor laser device can be defined by utilizing laser interference lithography and wet etching process, and therefore, its manufacture cost and time are effectively reduced in comparison to those of electron beam lithography technology.

One aspect of the invention relates to a distributed feedback (DFB) semiconductor laser device, which includes an active layer, a first grating layer and a second grating. The first grating layer has a first grating structure with a first grating period. The second grating layer has a second grating structure with a second grating period substantially different from the first grating period. The active layer, the first grating layer and the second grating layer are vertically stacked, and the equivalent grating period of the DFB semiconductor laser device is $(2 \times P1 \times P2)/(P1+P2)$, where P1 and P2 respectively represent the first grating period and the second grating period.

In accordance with one embodiment of the invention, the first grating layer and the second grating layer are at the same side of the active layer.

In accordance with one embodiment of the invention, the second grating layer is directly stacked over the first grating layer.

In accordance with one embodiment of the invention, the first grating layer and the second grating layer are respectively at two opposite sides of the active layer.

In accordance with one embodiment of the invention, the difference between the first grating period and the second grating period is substantially less than 1 nm.

In accordance with one embodiment of the invention, a filling factor of each of the first grating structure and the second grating structure is about 0.4 to 0.5.

In accordance with one embodiment of the invention, optical confinement factors of the first grating structure and the second grating structure are substantially the same.

Another aspect of the invention relates to an active layer and a grating layer having a grating structure. The active layer and the grating layer are vertically stacked, and the grating structure has a periodic height or depth variation.

In accordance with one embodiment of the invention, the height variation and depth variation of the grating structure correspond to the waveform generated by the superposition of two respective sinusoidal functions.

In accordance with one embodiment of the invention, heights of microstructures, depths of recesses of the grating structure, and the height and depth variation period thereof are adjusted by the exposure time or dose during holographic interference lithography process.

BRIEF DESCRIPTION OF THE DRAWINGS

Embodiments and advantages thereof can be more fully understood by reading the following description with reference made to the accompanying drawings as follows.

DETAILED DESCRIPTION

Figure 1:
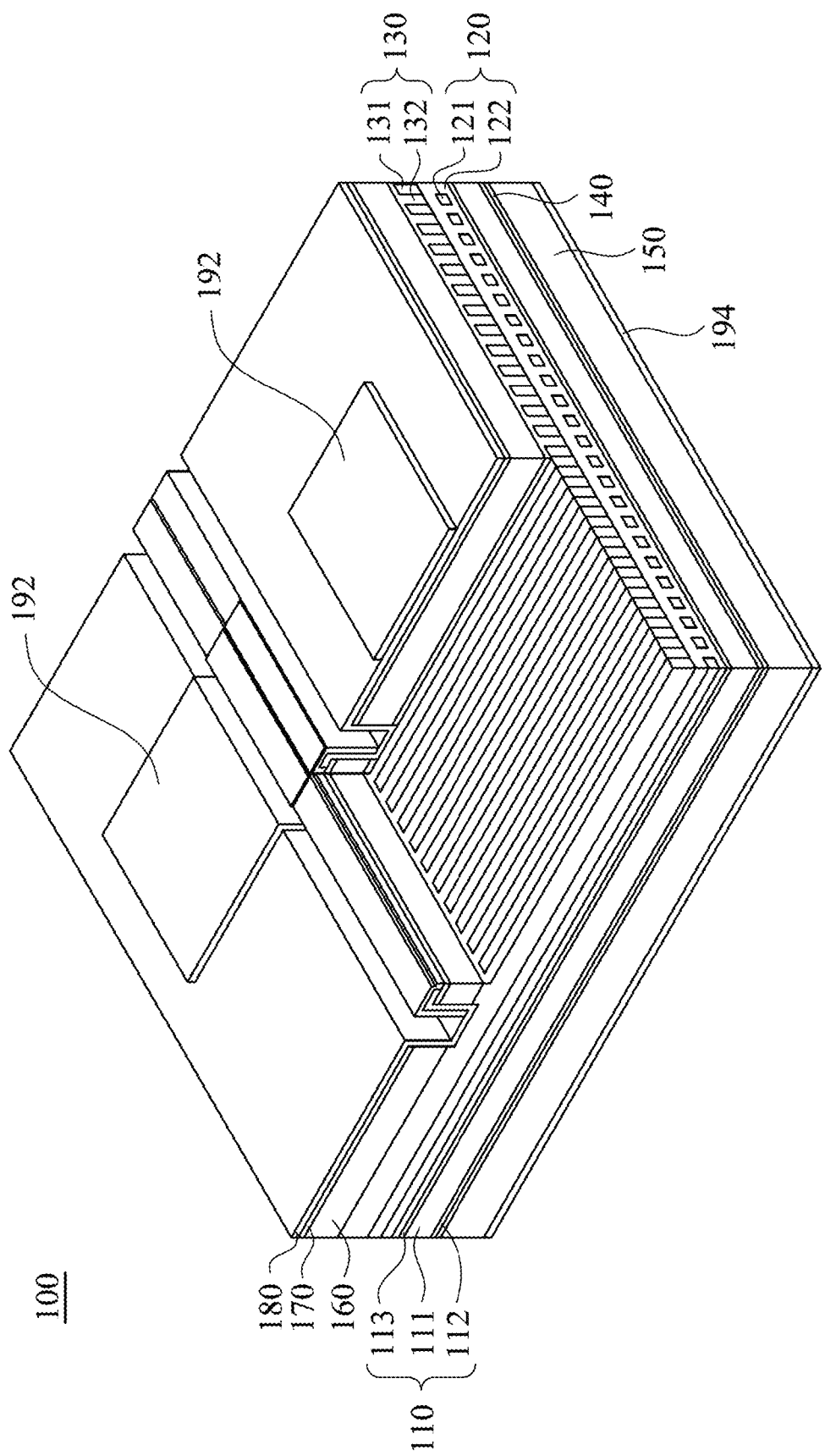
FIG. 1 is a perspective diagram of a DFB semiconductor device in accordance with one embodiment of the invention.

The spirit of the disclosure is clearly described hereinafter accompanying with the drawings and detailed descriptions. After realizing preferred embodiments of the disclosure, any persons having ordinary skill in the art may make various modifications and changes according to the techniques taught in the disclosure without departing from the spirit and scope of the disclosure.

Terms used herein are only used to describe the specific embodiments, which are not used to limit the claims appended herewith. Unless limited otherwise, the term "a," "an," "one" or "the" of the single form may also represent the plural form. Further, the spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

The document may repeat reference numerals and/or letters in the various examples. This repetition is for the purpose of simplicity and clarity and does not in itself dictate a relationship between the various embodiments and/or configurations discussed.

Further, spatially relative terms, such as "over," "on," "under," "below," and the like, may be used herein for ease of description to describe one element or feature's relationship to another element(s) or feature(s) as illustrated in the figures.

For conveniently understanding the contents of the application, the drawings could illustrate only a portion of the overall structure but are not intended to constitute any limit to the scope of the invention. Those ordinary skilled in the art are able to derive the overall structure directly from the drawings on the basis of the context in this document.

FIG. 1 is a perspective diagram of a distributed feedback (DFB) semiconductor laser device 100 in accordance with one embodiment of the invention. In the DFB semiconductor laser device 100, an active layer 110 includes a multiple quantum well (MQW) layer structure 111 and separate confinement heterostructure (SCH) layers 112, 113. The MQW layer structure 111 may include alternately stacked n number of quantum well layers and (n−1) or (n+1) number of barrier layers, in which the quantum well layers may be formed from indium gallium arsenide (InGaAs), and the barrier layers may be formed from indium aluminum gallium arsenide (InAlGaAs). The thickness of each quantum well layer may be about 5 nm, and the thickness of each barrier layer may be about 8.5 nm. The SCH layers 112, 113 are respectively at the upper and lower sides of the MQW layer structure 111, in which the SCH layer 112 may be formed of an $In_{0.53}Al_xGa_{(0.47-x)}As$ layer (where x is 0.36-0.44) with a thickness of 50 nm thickness and a P-type $In_{0.52}Al_{0.48}As$ layer with a thickness of 50 nm, while the SCH layer 113 may be formed of an $In_{0.53}Al_xGa_{(0.47-x)}As$ layer (where x is 0.36-0.44) with a thickness of 50 nm and an N-type $In_{0.52}Al_{0.48}As$ layer with a thickness of 50 nm.

Figure 2:
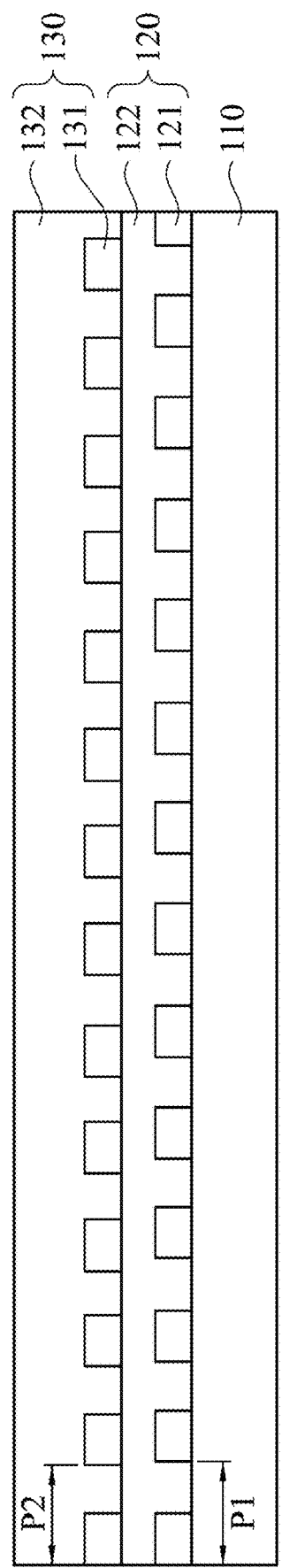
FIG. 2 is a cross sectional diagram of a portion of the DFB semiconductor laser device in FIG. 1.

Also referring to FIG. 2, which is a cross sectional diagram of a portion of the DFB semiconductor laser device 100. As shown in FIG. 1 and FIG. 2, a first grating layer 120 and a second grating layer 130 are sequentially stacked over the active layer 110. The first grating layer 120 has a first grating structure 121 and an overcoat layer 122, and the second grating layer 130 has a second grating structure 131 and an overcoat layer 132. The grating period P1 of the first grating structure 121 is different from the grating period P2 of the second grating structure 131. For the embodiment shown in FIG. 2, the grating period P1 of the first grating structure 121 is greater than the grating period P2 of the second grating structure 131. In another embodiment, the grating period P1 of the first grating structure 121 may be less than the grating period P2 of the second grating structure 131. The equivalent grating period of the combined first grating structure 121 and second grating structure 131 is $(2 \times P1 \times P2)/(P1+P2)$. The overcoat layer 122 covers the first grating structure 121 and fills the gaps in the first grating structure 121, and the overcoat layer 132 covers the second grating structure 131 and fills the gaps in the second grating structure 131. The refractive indexes of the first grating structure 121 and the second grating structure 131 may be respectively greater than those of the overcoat layers 122, 132.

The difference between the grating period P1 of the first grating structure 121 and the grating period P2 of the second grating structure 131 may be less than 1 nm, in order to ensure single-mode outputting of the DFB semiconductor laser device 100. In addition, the filling factors of first grating structure 121 and the second grating structure 131 may be about 0.4-0.5, in order to enhance the grating coupling strengths of the first grating structure 121 and the second grating structure 131.

The material of the first grating structure 121 and the second grating structure 131 may be P-type indium gallium arsenide phosphide (InGaAsP), and the material of the overcoat layers 122, 132 may be P-type indium phosphide (InP). In another embodiment, the first grating structure 121, the second grating structure 131 and the overcoat layers 122, 132 may be formed by another material. For example, the first grating structure 121 and the second grating structure 131 may be formed from P-type aluminum indium gallium phosphide (AlInGaP), and the overcoat layers 122, 132 may be formed from P-type gallium arsenide (GaAs). The thicknesses of the first grating structure 121 and the second grating structure 131 may be the same or different, and the materials for forming the first grating structure 121 and the second grating structure 131 may also be the same or different.

A buffer layer 140 is under the active layer 110 and may be formed from N-type InP. A substrate 150 is under the buffer layer 140. The thickness of the substrate 150 may be about 100 μm, and the substrate may be formed from InP. A cladding layer 160 is over the second grating layer 130. The thickness of the cladding layer may be about 2 µm, and the cladding layer may also be formed from P-type InP.

In some embodiments, a P-type InP layer with a thickness of about 10 nm, a P-type InGaAsP layer with a thickness of about 15 nm and a P-type InP with a thickness of about 25 nm may further be sequentially interposed between the active layer 110 and the first grating layer 120, and an N-type $In_{0.53}Al_xGa_{(0.47-x)}As$ layer with a thickness of about 10 nm may further be interposed between the active layer 110 and the buffer layer 140, where x is 0.36-0.44.

The elements over the cladding layer 160 include a contact layer 170, a passivation layer 180 and an upper electrode layer 192, and the elements under the substrate 150 include a lower electrode layer 194. As shown in FIG. 1, the contact layer 170 the passivation layer 180 and the upper electrode layer 192 form a ridge waveguide structure. The contact layer 170 may be formed from InGaAs and InGaAsP with high dopant concentration; the passivation layer 180 may be formed from silicon oxide; and the upper electrode layer 192 and the lower electrode layer 194 may be formed from titanium, platinum, gold, or another suitable metal.

Further, in accordance with application requirements, a high-reflection film and an anti-reflection film, or high-reflection films, or anti-reflection films, may be respectively deposited on two facets of the DFB semiconductor laser device 100, or alternatively, no film is deposited on any facet of the DFB semiconductor laser device 100.

Referring to FIG. 2 again. In the DFB semiconductor laser device 100, the first grating structure 121 and the second grating structure 131 with respect to a laser cavity may be aligned or misaligned. That is, the first grating structure 121 and the second grating structure 131 may be completely aligned, completely misaligned or partially aligned at any facet of the DFB semiconductor laser device 100 that forms a laser cavity.

Methods of fabricating the DFB semiconductor laser device 100 are illustrated as follows. First, a substrate 150 is provided, and subsequently a buffer layer 140 and an active layer 110 are sequentially formed over a plane of the substrate 150, in which the active layer 110 includes a lower SCH 112, a MQW layer structure 111 and an upper SCH 113 sequentially stacked from bottom to top. Afterwards, a first grating layer 120 and a second grating layer 130 are sequentially formed over the active layer 110. The following exemplifies forming of the first grating layer 120 and the second grating layer 130. First, a grating material layer is deposited on the active layer 110, and subsequently a laser interference lithographic process and a wet etching process are performed on the grating material layer, so as to form the first grating structure 121. An overcoat layer 122 is then formed atop the first grating structure 121. In another embodiment, a portion of the overcoat layer 122 may be formed and a grating material layer may be deposited on the active layer 110, and subsequently a laser interference lithographic process and a wet etching process are performed on the grating material layer, so as to form the first grating structure 121, and then the other portion of the first grating structure 121 is formed on the overcoat layer 122. After the first grating layer 120 is formed, another grating material layer is deposited on the first grating layer 120, and subsequently a laser interference lithographic process and a wet etching process are performed on the grating material layer, so as to form the second grating structure 131, and then the overcoat layer 132 is formed on the second grating structure 131.

Subsequently, a cladding layer 160 and a contact layer 170 are formed over the second grating layer 130, and a ridge region is defined. Afterwards, a passivation layer 180 and an upper electrode layer 192 are sequentially formed over the cladding layer 160 and the contact layer 170, so as to form ridge waveguide structures over the DFB semiconductor laser device 100, and at last a lower electrode layer 194 is formed over the other plane of the substrate 150.

Figure 3:
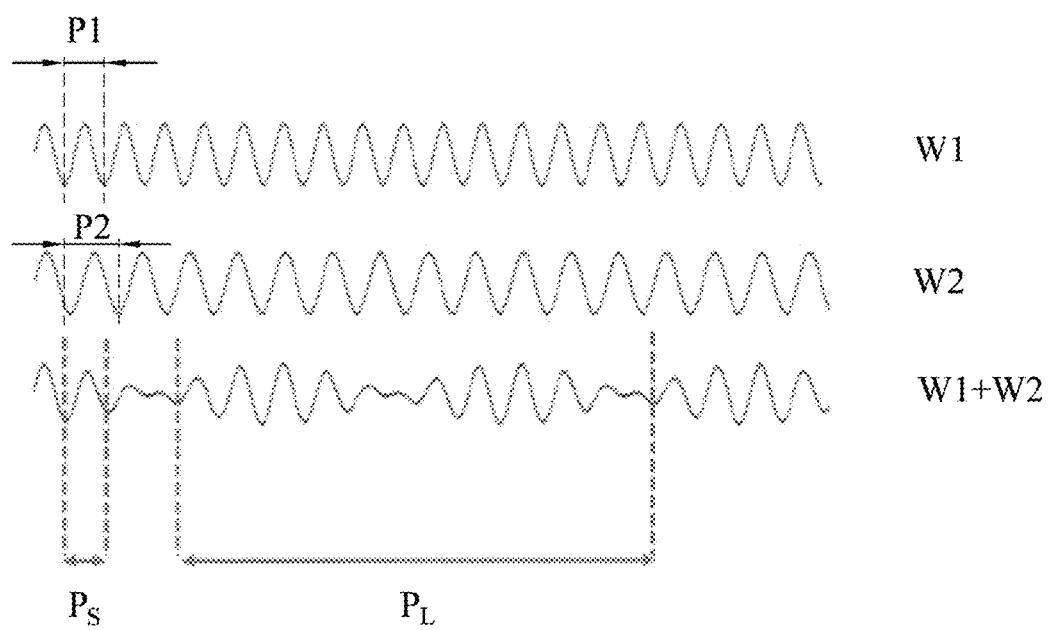
FIG. 3 shows waveforms of two sinusoidal waves with different periods and their superposition.

FIG. 3 shows waveforms of two sinusoidal waves with different periods and their superposition, in which the sinusoidal wave W1 is the profile of the first grating layer 120, and the sinusoidal wave W2 is the profile of the second grating layer 130. As shown in FIG. 3, the sinusoidal waves W1, W2 are all period sinusoidal waves, of which the periods are P1 and P2, respectively. The superposition wave W1+W2 of the sinusoidal waves W1, W2 is a periodic wave with an envelope that forms a short period $P_S$ and a long period $P_L$. The short period $P_S$ and the long period $P_L$ of the superposition wave W1+W2 are respectively $(2\times P1\times P2)/(P1+P2)$ and $(2\times P1\times P2)/|P1-P2|$. If the periods of the sinusoidal waves W1, W2 are respectively 202.16 nm and 201.84 nm, then the short period $P_S$ and the long period $P_L$ are respectively 202 nm and 250 µm, which respectively correspond to the equivalent grating period and the laser cavity length of the DFB semiconductor laser device 100. According to the relational expression $\lambda=2n_{eff}P_S$ with respect to the equivalent grating period $P_S$ and the light emission wavelength $\lambda$, the wavelength $\lambda$ of the laser light generated by the DFB semiconductor laser device 100 can be determined from the equivalent refractive index $n_{eff}$ and the equivalent grating period $P_S$.

Referring back to FIG. 2, the optical confinement factors of the first grating structure 121 and the second grating structure 131 are determined from of the thickness T1 of first grating structure 121 and the thickness T2 of the second grating structure 131. In a case where the grating periods of the first grating structure 121 and the second grating structure 131 are respectively 202.16 nm and 201.84 nm, if the thickness T1 of the first grating structure 121 and the thickness T2 of the second grating structure 131 are all 15 nm, then the optical confinement factors of the first grating structure 121 and the second grating structure 131 are respectively about 0.0154 and 0.0087. The grating coupling strengths of the first grating structure 121 and the second grating structure 131 are affected by the difference of the optical confinement factors between the first grating structure 121 and the second grating structure 131. If the thickness T2 of the second grating structure 131 is modified to be 27 nm, then the optical confinement factors of the first grating structure 121 and the second grating structure 131 respectively change to be about 0.0158 and 0.0158. The optical confinement factors of the first grating structure 121 and the second grating structure 131 are modified to be substantially the same, and therefore these two grating structures have the same grating coupling strength. In addition, the grating coupling strengths of the first grating structure 121 and the second grating structure 131 are about 42.8 $cm^{-1}$.

Figure 4:
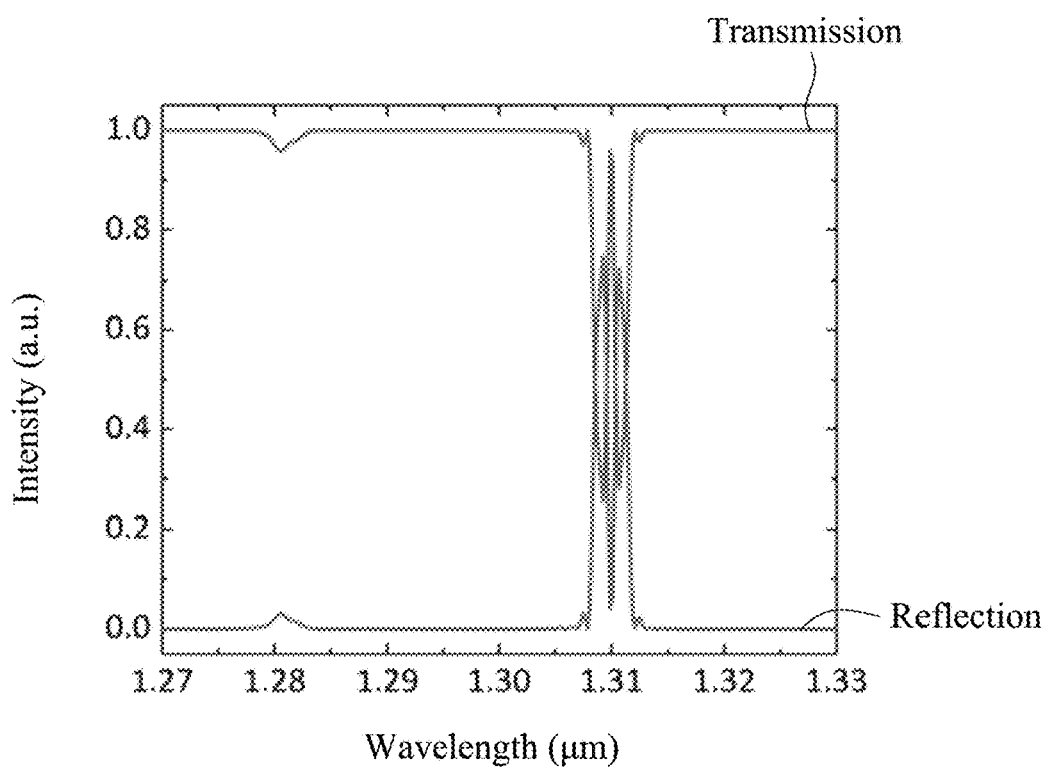
FIG. 4 shows a simulation result of the optical transmission and reflection spectra equivalently by the first grating structure and the second grating structure of the DFB semiconductor laser device in some embodiments of the invention.

FIG. 4 shows a simulation result of the optical transmission and reflection spectra equivalently generated by the first grating structure 121 and the second grating structure 131 in the DFB semiconductor laser device 100. As can be seen from FIG. 4, in the transmission and reflection spectra, the optical transmission and reflection strength has an obvious change at the wavelength of about 1.31 µm (i.e. the Bragg wavelength of 1310 nm) but approximately remains unchanged at the other wavelengths. In addition, if the phase difference between the first grating structure 121 and the second grating structure 131 is changed, e.g., the phase difference between the first grating structure 121 and the second grating structure 131 is modified from 0 to 90 degrees, then the generated optical transmission and reflection spectra are still similar to the optical transmission and reflection spectra shown in FIG. 4, and therefore, in the DFB semiconductor laser device 100, accurate alignment between the first grating structure 121 and the second grating structure 131 is not required. As can be seen from above, the optical transmission and reflection spectra equivalently generated by the first grating structure 121 and the second grating structure 131 has frequency response characteristics of a phase-shifted grating.

Figure 5:
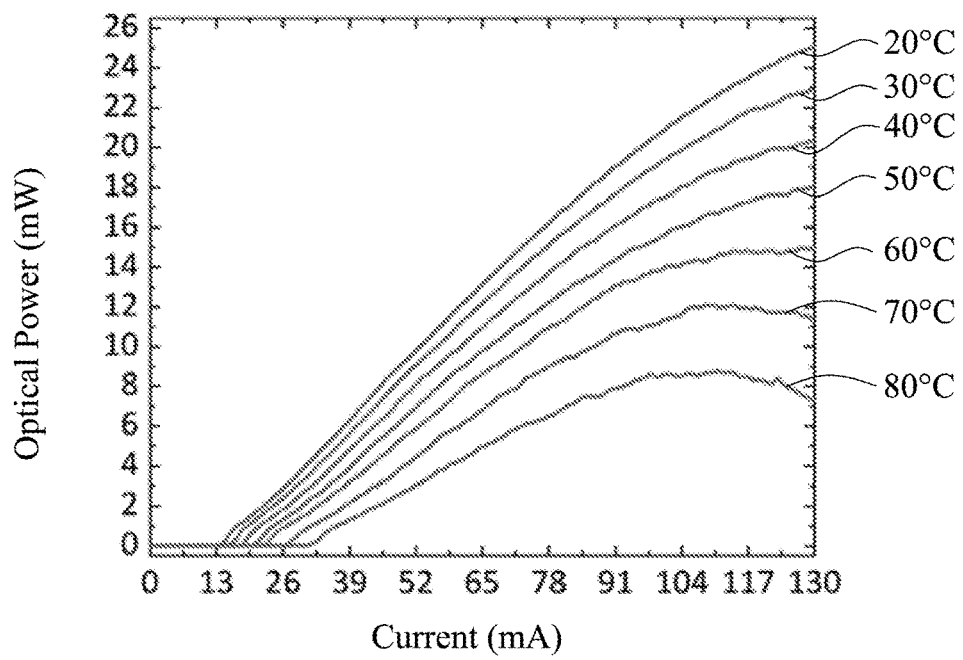
FIG. 5 shows an experimental result of the light emission power of the DFB laser at various temperatures and operating currents, in which the light is generated by the DFB semiconductor laser device in some embodiments of the invention.

FIG. 5 shows an experimental result of the light emission power of the DFB laser at various temperatures and operating currents, in which the light is generated by the DFB semiconductor laser device 100. It is known by analyzing the measurement result of FIG. 5 that the threshold current and the characteristic temperature of the DFB semiconductor laser device 100 are respectively 13 mA and 78 K, and the output power may be greater than 10 mW at the environmental temperature of 60° C.

Figure 6:
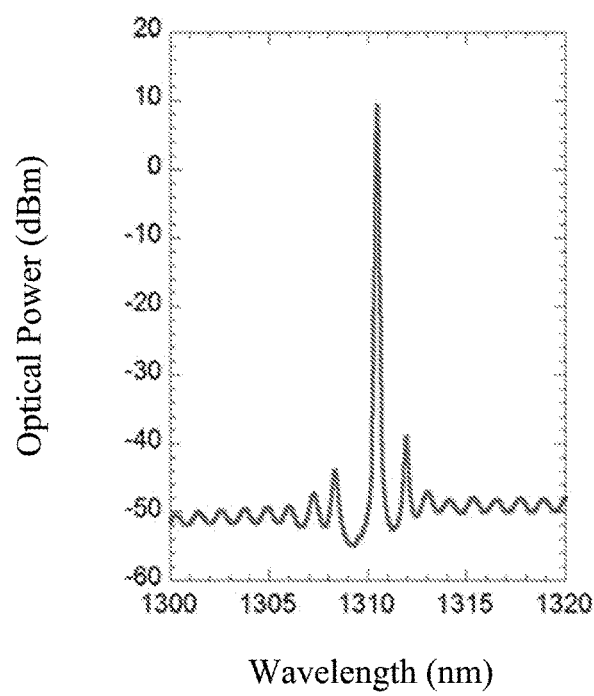
FIG. 6 shows a measured optical spectrum of the DFB laser at the environmental temperature of 20° C., in which the light is generated by the DFB semiconductor laser device in some embodiments of the invention.

FIG. 6 shows the measured light emission spectra characteristic of the DFB laser at the environmental temperature of 20° C., in which the light is generated by the DFB semiconductor laser device 100. The measurement result of FIG. 6 reveals that the wavelength of the laser light generated by the DFB semiconductor laser device 100 is at its Bragg wavelength (closed to 1310 nm) rather than at its stopband edges, which is equivalent to the signature of a quarter-wavelength phase-shifted DFB laser.

Figure 7:
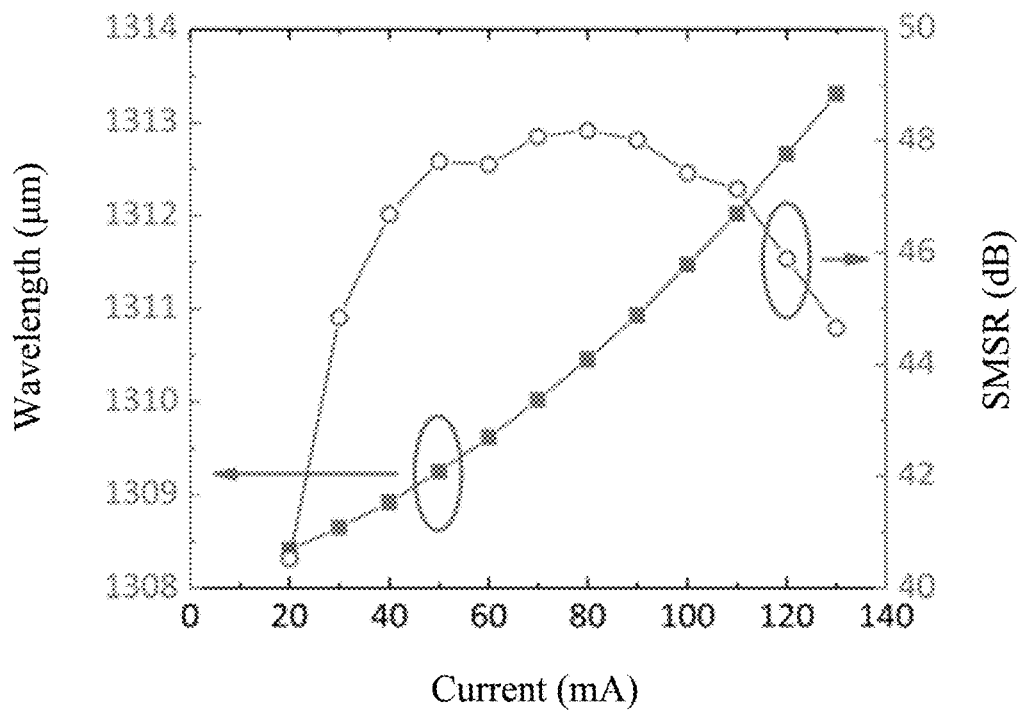
FIG. 7 shows an experimental result of variations of the wavelength and the side mode suppression ratio (SMSR) of the DFB laser under different operating currents at a fixed environmental temperature of 20° C., in which the light is generated by the DFB semiconductor laser device in some embodiments of the invention.
Figure 8:
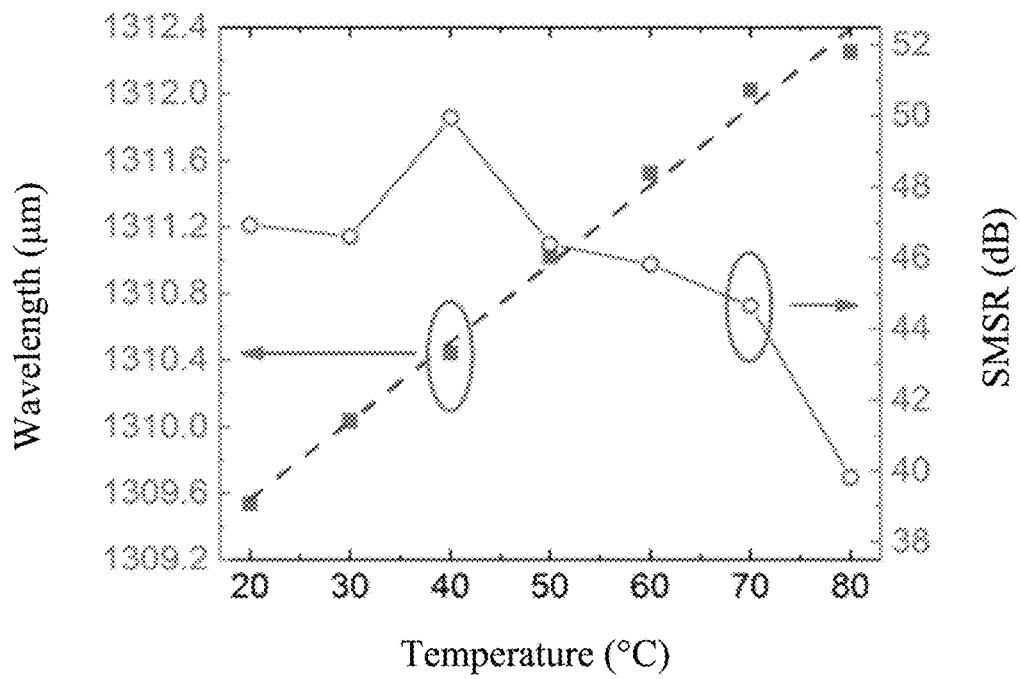
FIG. 8 shows an experimental result of variations of the wavelength and the SMSR of the DFB laser under different environmental temperatures at a fixed operating current of 60 mA, in which the light is generated by the DFB semiconductor laser device in some embodiments of the invention.

FIG. 7 shows an experimental result of variations of the wavelength and the side mode suppression ratio (SMSR) of DFB laser under different operating currents at the environmental temperature of 20° C., and FIG. 8 shows an experimental result of variations of the wavelength and the SMSR of DFB laser under different environmental temperatures at a fixed operating current of 60 mA. FIG. 7 and FIG. 8 reveal that the SMSR of the laser light generated by the DFB semiconductor laser device 100 is greater than 40 dB at the operating current of 20-130 mA and the environmental temperature of 20-80° C., indicating that the DFB semiconductor laser device 100 has superior single-mode characteristics behavior. FIG. 7 and FIG. 8 also reveal that the wavelength shift amount per current and the wavelength shift amount per temperature of the laser light generated by the DFB semiconductor laser device 100 are respectively 34 pm/mA and 47 pm/K.

Figure 9:
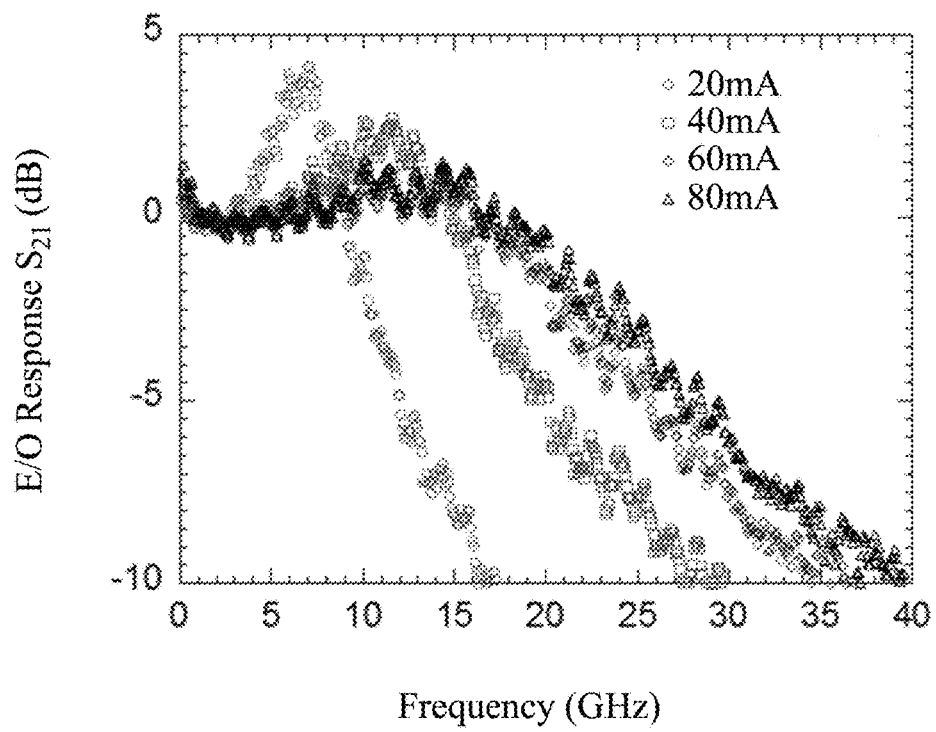
FIG. 9 shows an experimental result of the small signal DO response S21 of the DFB laser light under various operating currents, in which the light is generated by the DFB semiconductor laser device in some embodiments of the invention.

FIG. 9 shows an experimental result of the small signal DO response S21 of the DFB laser light generated by the DFB semiconductor laser device in some embodiments of the invention for various operating currents. As can be seen from FIG. 9, the −3 dB bandwidths for the operating currents of 20 mA to 80 mA are all greater than 10 GHz.

Figure 10:
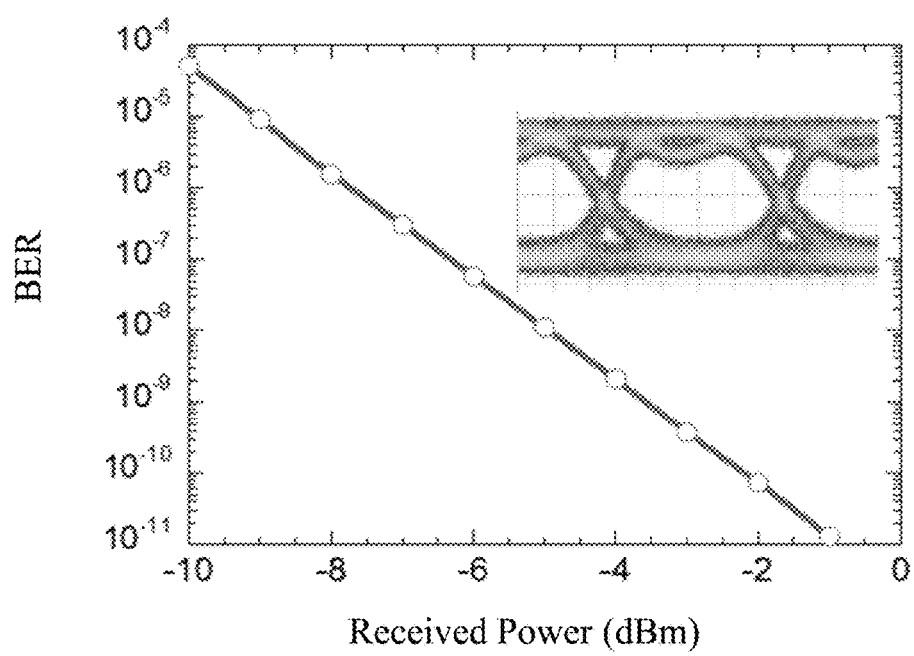
FIG. 10 shows an experimental result of the corresponding bit error rate (BER) and the optical eye diagram of the DFB laser under an operating current of 60 mA, in which the light is generated by the DFB semiconductor laser device in some embodiments of the invention.

Furthermore, a pulse pattern generator (PPG) is utilized to generate a $(2^{31}-1)$ non-return-to-zero (NRZ) pseudo-random binary sequence (PRBS) with a peak-to-peak voltage of 2 V. At the receiver side, a 32 Gb/s PIN photodetector is utilized to receive the optical signal, and a sampling oscilloscope is utilized to display the measurement result. The extinction ratio of the 10 Gb/s non-return-to-zero (NRZ) signal is set to 5.7 dB. FIG. 10 shows a measurement result of the relationship between the bit error rate (BER) and the receiving power and the optical eye diagram of the DFB laser light generated by the DFB semiconductor laser device 100 at the operating current of 60 mA. FIG. 10 reveals that no error occurs in the back-to-back (BTB) transmission at a data rate of 10 Gb/s.

Figure 11:
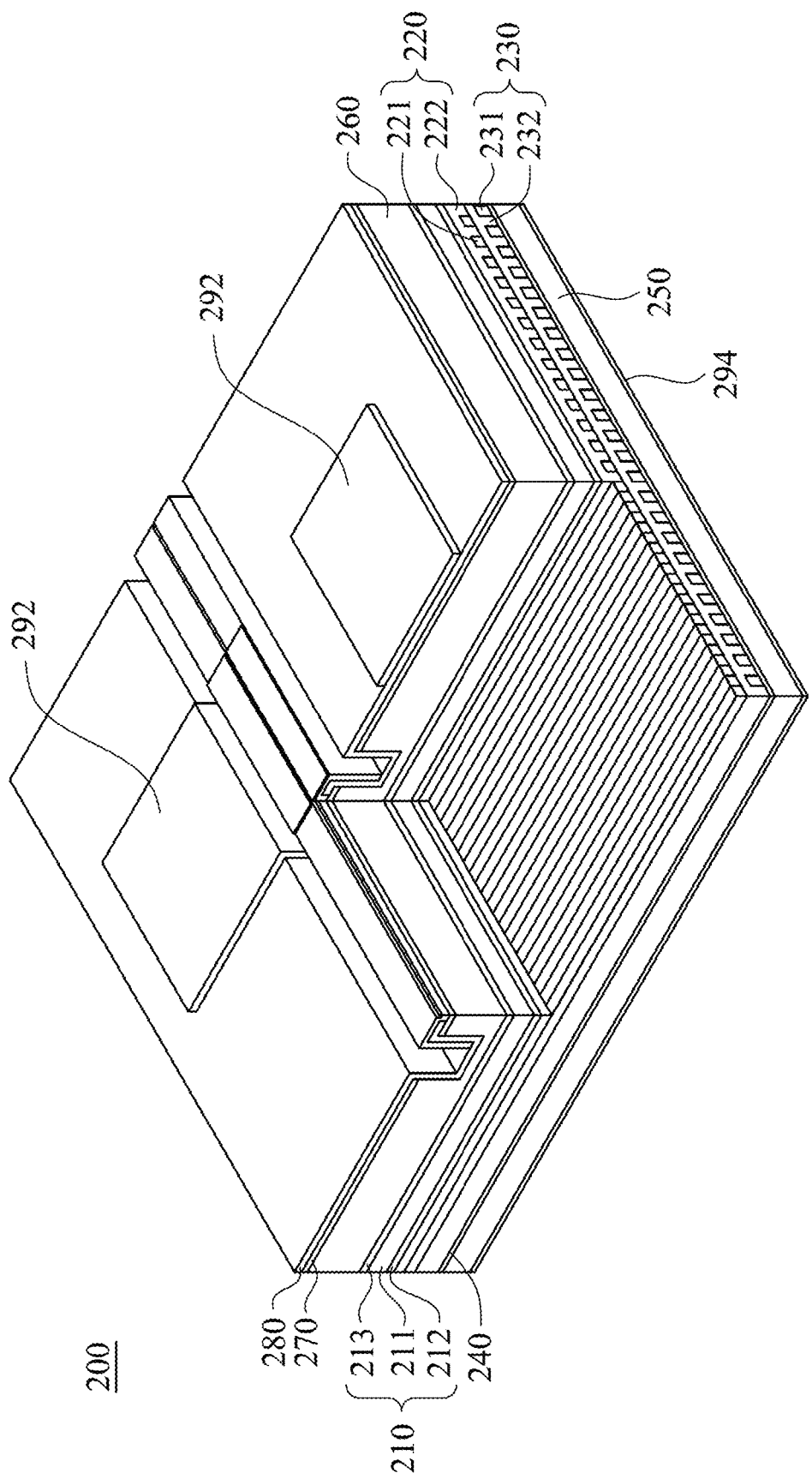
FIG. 11 is a perspective diagram of a DFB semiconductor device in accordance with another embodiment of the invention.
Figure 12:
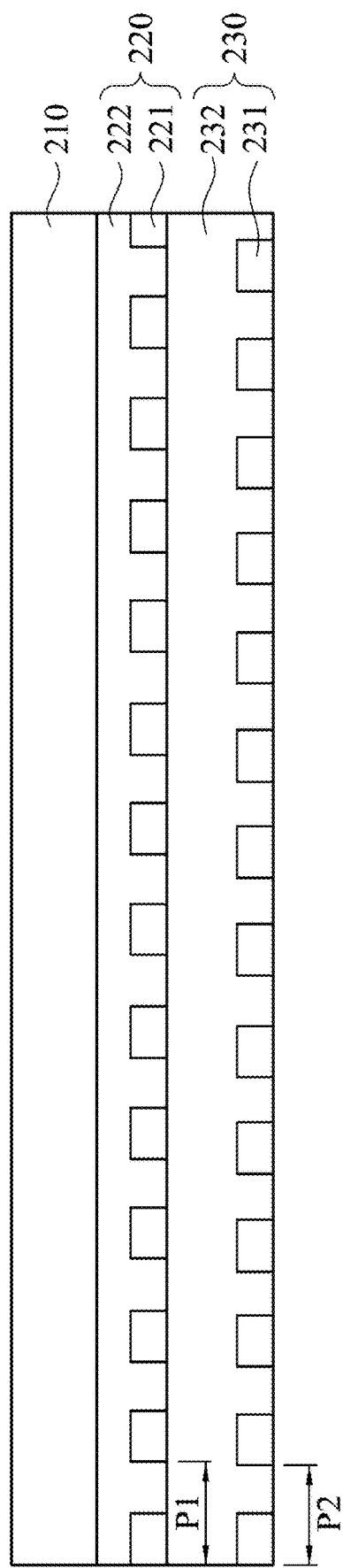
FIG. 12 is a cross sectional diagram of a portion of the DFB semiconductor laser device in FIG. 11.

FIG. 11 is a perspective diagram of a DFB semiconductor laser device 200 in accordance with another embodiment of the invention. As shown in FIG. 11, the DFB semiconductor laser device 200 includes an active layer 210, a first grating layer 220, a second grating layer 230, a buffer layer 240, a substrate 250, a cladding layer 260, a contact layer 270, a passivation layer 280, an upper electrode layer 292 and a lower electrode layer 294, in which the active layer 210 includes an MQW layer structure 211 and a lower SCH 212 and an upper SCH 213 respectively at two opposite sides of the MQW layer structure 211, the first grating layer 220 includes a first grating structure 221 and an overcoat layer 222, and the second grating layer 230 includes a second grating structure 231 and an overcoat layer 232. Also referring to FIG. 12, which is a cross sectional diagram of a portion of the DFB semiconductor laser device 200. As shown in FIG. 11 and FIG. 12, the first grating layer 220 and the second grating layer 230 are sequentially stacked beneath the active layer 210, in which the grating periods of the first grating structure 221 and the second grating structure 231 are different. For the embodiment shown in FIG. 12, the grating period P1 of the first grating structure 221 is greater than the grating period P2 of the second grating structure 231. In another embodiment, the grating period P1 of the first grating structure 221 may be less than the grating period P2 of the second grating structure 231. The equivalent grating period of the combined first grating structure 221 and second grating structure 231 is (2×P1×P2)/(P1+P2). The overcoat layer 222 covers the first grating structure 221 and fills the gaps in the first grating structure 221, and the overcoat layer 232 covers the second grating structure 231 and fills the gaps in the second grating structure 231. The refractive indexes of the first grating structure 221 and the second grating structure 231 may be respectively greater than those of the overcoat layers 222, 232.

The material of the first grating structure 221 and the second grating structure 231 may be N-type INGaAsP, and the material of the overcoat layers 222, 232 may be N-type InP. In another embodiment, the first grating structure 221, the second grating structure 231 and the overcoat layers 222, 232 may be formed from another material. For example, the first grating structure 221 and the second grating structure 231 may be formed from N-type AlInGaP, and the overcoat layers 222, 232 may be formed from N-type GaAs.

The buffer layer 240 is over the second grating layer 230 and may be formed from N-type InP. The substrate 250 is under the buffer layer 240; the thickness of the substrate 250 may be about 100 μm, and the substrate 250 may be formed from InP. The cladding layer 260 is over the buffer layer 240; the thickness of the cladding layer 260 may be about 2 μm, and the cladding layer 260 may be formed from P-type InP.

In some embodiments, a further N-type $In_{0.53}Al_xGa_{(0.47-x)}As$ layer of about 10 nm thickness may be between the active layer 210 and the first grating layer 220, and a further P-type $In_{0.53}Al_xGa_{(0.47-x)}As$ layer of about 50 nm thickness may be between the active layer 210 and the cladding layer 260, where x is 0.36-0.44.

The arrangements of the contact layer 270, the passivation layer 280, the upper electrode layer 292 and the lower electrode layer 294 may be respectively similar to those of the contact layer 170, the passivation layer 180, the upper electrode layer 192 and the lower electrode layer 194 of the DFB semiconductor laser device 100, and therefore the related description can be referred to the foregoing paragraphs and is not repeated herein.

Similarly, in accordance with application requirements, a high-reflection coating and an anti-reflection coating, or two high-reflection coatings, or two anti-reflection coatings, may be respectively deposited on the two facets of the DFB semiconductor laser device 200 that form a laser cavity. Alternatively, the DFB semiconductor laser device 200 may not have any coating deposited on the two facets thereof. In addition, in the DFB semiconductor laser device 200, the relative positions of the first grating structure 221 and the second grating structure 231 with respect to the laser cavity may be aligned or misaligned.

Methods of fabricating the DFB semiconductor laser device 200 are illustrated as follows. First, a substrate 250 is provided, and subsequently a buffer layer 240, a second grating layer 230 and a first grating layer 220 are sequentially over a plane of the substrate 250. The following exemplifies forming of the first grating layer 220 and the second grating layer 230. First, a grating material layer is deposited on the buffer layer 240, and subsequently a grating structure region is defined on the grating material layer, and a laser interference lithographic process and a wet etching process are also performed, so as to form a second grating structure 231 and then form an overcoat layer 232 on the second grating structure 231. In another embodiment, a portion of the overcoat layer 232 may be formed and a grating material layer may be deposited on the buffer layer 240 first, and subsequently a laser interference lithographic process and a wet etching process are performed on the grating material layer, so as to form the second grating structure 231, and then the other portion of the overcoat layer 232 is formed on the second grating structure 231. After the second grating layer 230 is formed, another grating material layer is deposited on the second grating layer 230, and subsequently a laser interference lithographic process and a wet etching process are performed on the grating material layer, so as to form the first grating structure 221, and then the overcoat layer 222 is formed on the first grating structure 221.

Afterwards, an active layer 210 is formed over the first grating layer 220. The active layer 210 includes a lower SCH 212, the MQW layer structure 211 and an upper SCH 213 sequentially stacked from bottom to top. Next, a cladding layer 260 and a contact layer 270 are formed over the active layer 210, and a ridge region is defined, and then a passivation layer 280 and an upper electrode layer 292 are sequentially formed over the cladding layer 260 and the contact layer 270, so as to form a ridge waveguide structure on the DFB semiconductor laser device 200, and at last a lower electrode layer 294 is formed over another plane of the substrate 250.

Figure 13:
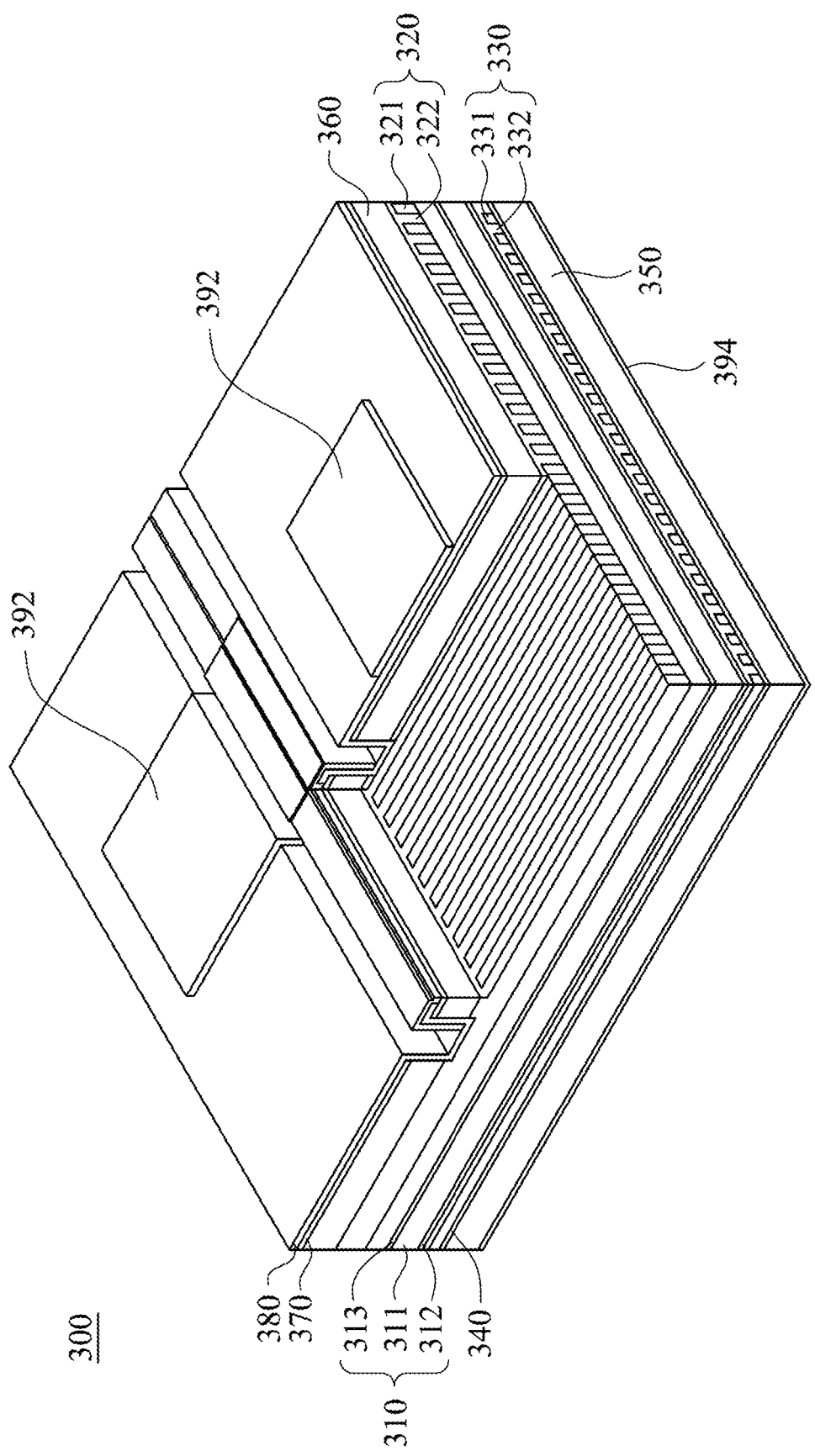
FIG. 13 is a perspective diagram of a DFB semiconductor device in accordance with another embodiment of the invention.
Figure 14:
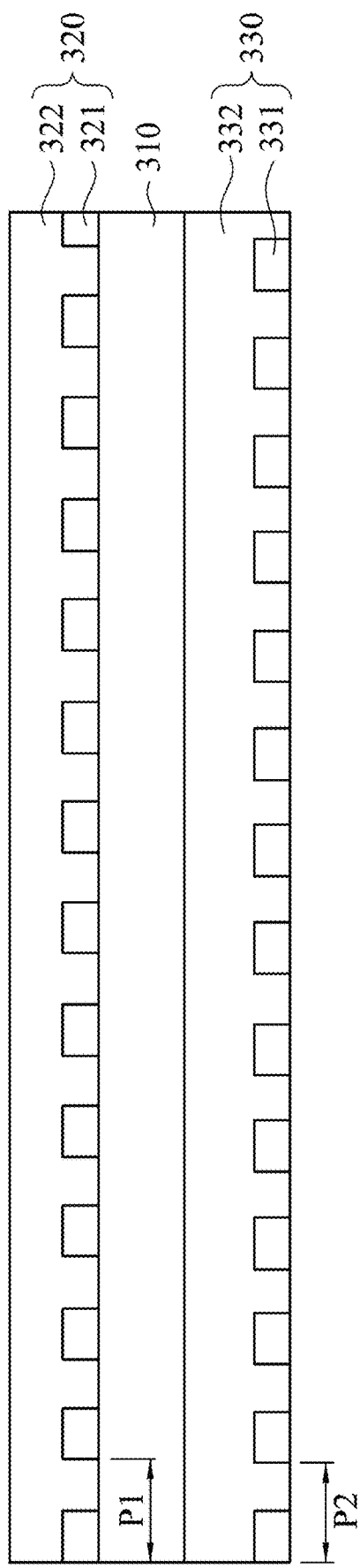
FIG. 14 is a cross sectional diagram of a portion of the DFB semiconductor laser device in FIG. 13.

FIG. 13 is a perspective diagram of a DFB semiconductor laser device 300 in accordance with another embodiment of the invention. As shown in FIG. 13, the DFB semiconductor laser device 300 includes an active layer 310, a first grating layer 320, a second grating layer 330, a buffer layer 340, a substrate 350, a cladding layer 360, a contact layer 370, a passivation layer 380, an upper electrode layer 392 and a lower electrode layer 394, in which the active layer 310 includes an MQW layer structure 311 and a lower SCH 312 and an upper SCH 313 respectively at two opposite sides of the MQW layer structure 311, the first grating layer 320 includes a first grating structure 321 and an overcoat layer 322, and the second grating layer 330 includes a second grating structure 332 and an overcoat layer 332. Also referring to FIG. 14, which is a portion of the DFB semiconductor laser device 300. As shown in FIG. 13 and FIG. 14, the first grating layer 320 and the second grating layer 330 are respectively over and under the active layer 310, and the grating periods of the first grating structure 321 and the second grating structure 331 are different. For the embodiment shown in FIG. 14, the grating period P1 of the first grating structure 321 is greater than the grating period P2 of the second grating structure 331. In another embodiment, the grating period P1 of the first grating structure 321 may be less than the grating period P2 of the second grating structure 331. The equivalent grating period of the combined first grating structure 321 and second grating structure 331 is (2×P1×P2)/(P1+P2). The overcoat layer 322 covers the first grating structure 321 and fills the gaps in the first grating structure 321, and the overcoat layer 332 covers the second grating structure 331 and fills the gaps in the second grating structure 331. The refractive indexes of the first grating structure 321 and the second grating structure 331 may be respectively greater than those of the overcoat layers 322, 332.

The material of the first grating structure 321 may be P-type INGaAsP, and the material of the overcoat layer 322 may be P-type InP. In addition, the material of the second grating structure 331 may be N-type INGaAsP, and the material of the overcoat layer 332 may be N-type InP. In another embodiment, the first grating structure 321, the second grating structure 331 and the overcoat layers 322, 332 may be formed from another material. For example, the first grating structure 321 and the second grating structure 331 may be respectively formed from P-type AlInGaP and N-type AlInGaP, and the overcoat layers 322, 332 may be respectively formed from P-type GaAs and N-type GaAs.

The buffer layer 340 is under the second grating layer 330 and may be formed from N-type InP. The substrate 350 is under the buffer layer 340; the thickness of the substrate 350 may be about 100 μm, and the substrate 350 may be formed from InP. The cladding layer 360 is over the first grating structure 320; the thickness of the cladding layer 360 may be about 2 μm, and the cladding layer 360 may also be formed from InP.

In some embodiments, a further P-type $In_{0.53}Al_xGa_{(0.47-x)}As$ layer of about 50 nm thickness may be between the active layer 310 and the first grating layer 320, and a further N-type $In_{0.53}Al_xGa_{(0.47-x)}As$ layer of about 10 nm thickness may be between the active layer 310 and the buffer layer 340, where x is 0.36-0.44.

The arrangements of the contact layer 370, the passivation layer 380, the upper electrode layer 392 and the lower electrode layer 394 may be respectively similar to those of the contact layer 170, the passivation layer 180, the upper electrode layer 192 and the lower electrode layer 194 in the DFB semiconductor laser device 100, and therefore the related description can be referred to the foregoing paragraphs and is not repeated herein.

Similarly, in accordance with application requirements, a high-reflection coating and an anti-reflection coating, or two high-reflection coatings, or two anti-reflection coatings, may be respectively deposited on the two facets of the DFB semiconductor laser device 300 that form a laser cavity. Alternatively, the DFB semiconductor laser device 300 may not have any coating deposited on the two facets thereof. In addition, in the DFB semiconductor laser device 300, the relative positions of the first grating structure 321 and the second grating structure 331 with respect to the laser cavity may be aligned or misaligned.

Methods of fabricating the DFB semiconductor laser device 300 are illustrated as follows. First, a substrate 350 is provided, and subsequently a buffer layer 340 a second grating layer 330 are sequentially formed over a plane of the substrate 350. The second grating layer 330 may be formed in a similar way to the second grating layer 230 of the DFB semiconductor laser device 200. Afterwards, an active layer 310 is formed over the second grating layer 330. The active layer 310 includes a lower SCH 312, an MQW layer structure 311 and an upper SCH 313 sequentially stacked from bottom to top. Next, a first grating layer 320 is formed over the active layer 310, and then a cladding layer 360 and a contact layer 370 are formed over the first grating layer 320, and a ridge region is defined. The first grating layer 320 may be formed in a similar way to the first grating layer 120 of the DFB semiconductor laser device 100. Afterwards, the cladding layer 360 and the contact layer 370 are sequentially formed over the passivation layer 380 and the upper electrode layer 392, so as to form a ridge waveguide structure on the DFB semiconductor laser device 300, and at last a lower electrode layer 394 is formed over another plane of the substrate 350.

The major difference among the DFB semiconductor laser device 100, 200, 300 is as follow: in the DFB semiconductor laser device 100, the first grating layer 120 and the second grating layer 130 are over the active layer 110; in the DFB semiconductor laser device 200, the first grating layer 220 and the second grating layer 230 and under the active layer 210; in the DFB semiconductor laser device 300, the first grating layer 320 and the second grating layer 330 are over and under the active layer 310, respectively. However, the equivalent reflective index is fixed regardless of whether the two grating layers are formed over the active layer, under the active layer or respectively over and under the active layer, and therefore the characteristics of phase-shifted grating in the DFB semiconductor laser devices 100, 200, 300 are also the same. In particular, in the DFB semiconductor laser device 200, the first grating layer 220 and the second grating layer 230 are under the active layer 210, and thus the thickness of the structure over the active layer 210 is thinned, such that the leakage current and the threshold current are further reduced, thus improves the light emission efficiency of the laser component.

Figure 15:
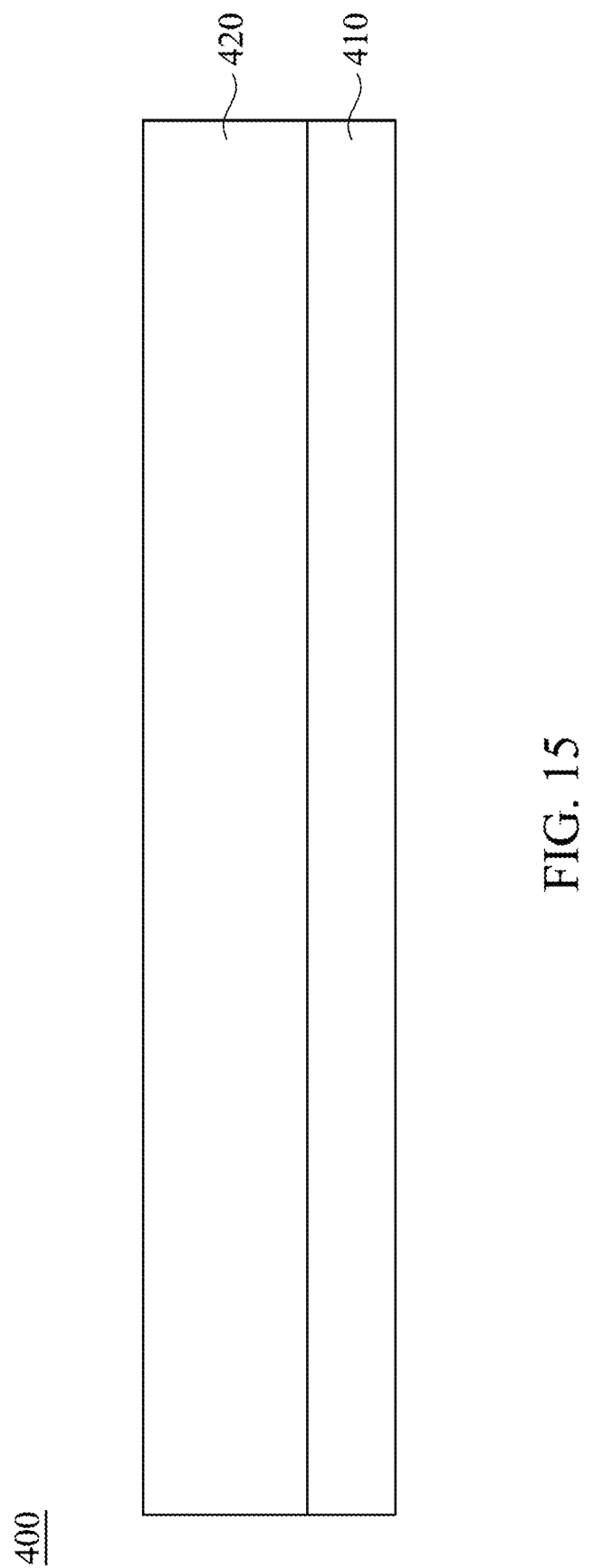
FIG. 15 is a cross sectional diagram of a portion of a DFB semiconductor laser device in accordance with another embodiment of the invention.
Figure 16A:
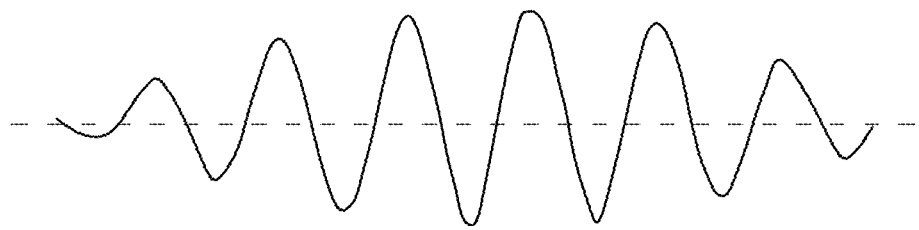
FIG. 16A is a waveform diagram of the DFB semiconductor laser device in FIG. 15.
Figure 16B:
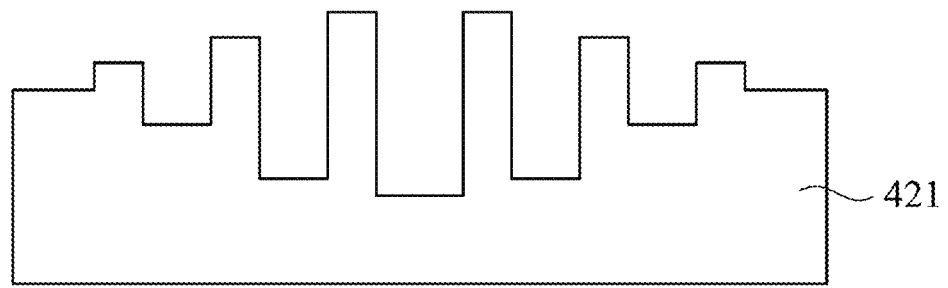
FIG. 16B to FIG. 16D are various exemplary examples of the grating layer in FIG. 15.
Figure 16C:
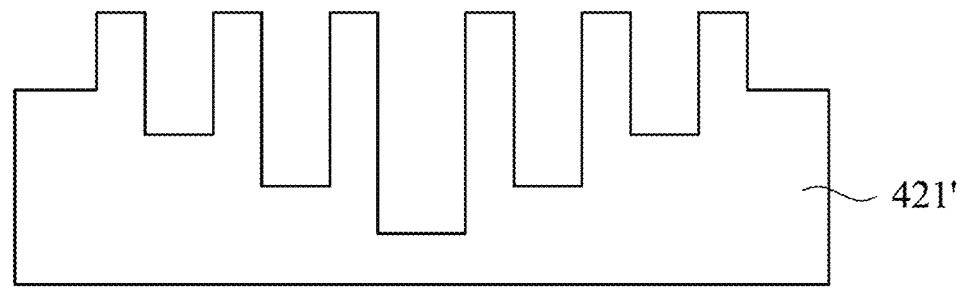
Figure 16D:
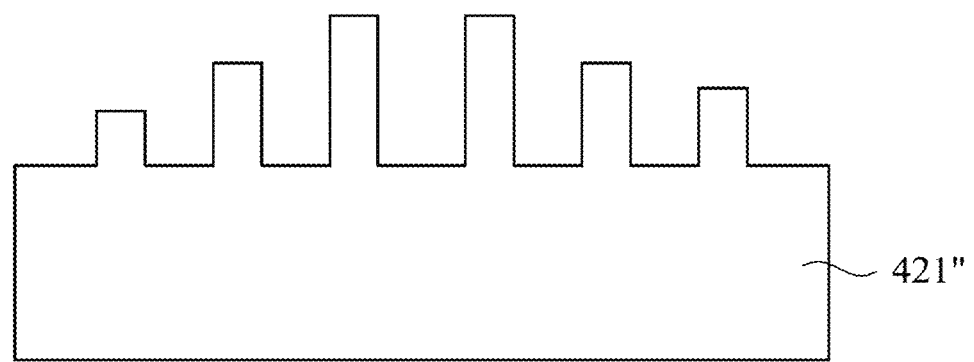

FIG. 15 is a cross sectional diagram of a portion of a DFB semiconductor laser device 400 in accordance with another embodiment of the invention. In FIG. 15, a grating layer 420 is over an active layer 410 and includes an amplitude moiré wave grating structure that can be formed by utilizing two holographic interference lithographic processes, in which the interference fringe periods respectively generated by the first exposure step and the second exposure step are different. Also referring to FIG. 16A to FIG. 16D, in which FIG. 16A is a waveform diagram of the amplitude moiré wave grating structure, and FIG. 16B to FIG. 16D are respectively various examples of the grating layer 420. The waveform shown in FIG. 16A is similar to that of the superposition wave W1+W2 shown in FIG. 3, in which also forms a short period $P_S$ and a long period $P_L$. Each of the grating structures 421, 421', 421" shown in FIG. 16B to FIG. 16D is a part of the grating layer 420 and is an amplitude moiré wave grating structure. The difference between the grating structures 421, 421', 421" is, the grating structure 421 has periodic height and depth variations, the grating structure 421' only has a periodic depth variation, while the grating structure 421" only has a periodic height variation. The abovementioned periodic height and depth variations correspond to a superposed waveform from two different sinusoidal functions, such as the superposed waveform of the sinusoidal waves W1, W2 shown in FIG. 3, i.e. the waveform of the superposition wave W1+W2. In addition, the heights of the microstructures, the depths of the recesses and the height and depth variation period (i.e. the long period $P_L$) of each of the grating structures 421, 421', 421" may be adjusted based on exposure time or a dose of the holographic interference lithography process.

Each of the grating structures 421, 421', 421" may further be covered by an overcoat layer with a lower refractive index. According to the type of the DFB semiconductor laser device 400, the material of the grating structures 421, 421', 421" may be P-type or N-type INGaAsP, and the material of the overcoat layers may be P-type or N-type InP. Further, in another embodiment, the grating layer 420 may be under the active layer 410.

The other components of the DFB semiconductor laser device 400 not shown in FIG. 15, such as a buffer layer, a substrate, a cladding layer, a contact layer, a passivation layer, an upper electrode layer and a lower electrode layer, may be respectively similar to the buffer layer 140, the substrate 150, the cladding layer 160, the contact layer 170, the passivation layer 180, the upper electrode layer 192 and the lower electrode layer 194 of the DFB semiconductor laser device 100, or may be respectively similar to the buffer layer 240, the substrate 250, the cladding layer 260, the contact layer 270, the passivation layer 280, the upper electrode layer 292 and the lower electrode layer 294 of the DFB semiconductor laser device 200, and therefore the related description can be referred to the foregoing paragraphs and is not repeated herein.

Although the invention is described above by means of the implementation manners, the above description is not intended to limit the invention. A person of ordinary skill in the art can make various variations and modifications without departing from the spirit and scope of the invention, and therefore, the protection scope of the invention is as defined in the appended claims.

What is claimed is:

1. A distributed feedback (DFB) semiconductor laser device, comprising:
    an active layer having an upper surface;
    a first grating layer having a plurality of first elements, each of the first elements having a height measured in a direction normal to the upper surface of the active layer, and a length and a width measured in opposite directions and along the upper surface of the active layer, wherein the first elements are arranged along the direction of the widths thereof and in a first grating period; and
    a second grating layer having a plurality of second elements, each of the second elements having a height measured in the direction normal to the upper surface of the active layer, and a length and a width measured in opposite directions and along the upper surface of the active layer, wherein the second elements are arranged along the direction of the widths thereof and in a second grating period, the first elements are misaligned with the second elements in the direction normal to the upper surface of the active layer, and the misalignment between the first elements and the second elements increases for at least a number of the first and second elements along the direction of the widths of the first and second elements;
    wherein the active layer, the first grating layer and the second grating layer are vertically stacked, when viewed in cross section cut along the direction normal to the upper surface of the active layer and along the widths of the first and second elements of the first and second grating structures, respectively, the first grating period extends from a leftmost end of one of the first elements to a leftmost end of the adjacent first element, the second grating period extends from a leftmost end of one of the second elements to a leftmost end of the adjacent second element, and an equivalent grating period of the DFB semiconductor laser device is (2×P1×P2)/(P1+P2), where P1 and P2 are respectively the first grating period and the second grating period.

2. The DFB semiconductor laser device of claim 1, wherein the first grating layer and the second grating layer are at the same side of the active layer.

3. The DFB semiconductor laser device of claim 2, wherein the second grating layer is directly stacked over the first grating layer.

4. The DFB semiconductor laser device of claim 1, wherein the first grating layer and the second grating layer are respectively at two opposite sides of the active layer.

5. The DFB semiconductor laser device of claim 1, wherein a filling factor of each of the first grating structure and the second grating structure is about 0.4 to 0.5.

6. The DFB semiconductor laser device of claim 1, wherein optical confinement factors of the first grating structure and the second grating structure are substantially the same.

7. The DFB semiconductor laser device of claim 1, wherein each of the first and second elements has a rectangular strip shape.

8. The DFB semiconductor laser device of claim 1, further comprising:
a high-reflection film and an anti-reflection film respectively disposed on two facets thereof.

9. The DFB semiconductor laser device of claim 8, wherein a distance between the high-reflection film and the anti-reflection film is three-quarters of (2×P1×P2)/|P1−P2|, and a distance between the high-reflection film and a π phase-shift point is one-quarter of (2×P1×P2)/|P1−P2|.

10. The DFB semiconductor laser device of claim 1, further comprising:
two anti-reflection films respectively disposed on two facets thereof.

11. The DFB semiconductor laser device of claim 10, wherein a distance between the anti-reflection films is (2×P1×P2)/|P1−P2|, and a distance between one of the anti-reflection films and a π phase-shift point is one-half of (2×P1×P2)/|P1−P2|.

12. The DFB semiconductor laser device of claim 1, wherein the first grating period differs by more than 0 and less than 1 nm from the second grating period.

* * * * *